United States Patent
Goh et al.

(10) Patent No.: US 12,427,446 B2
(45) Date of Patent: Sep. 30, 2025

(54) LIQUID SUPPLYING UNIT AND LIQUID SUPPLYING METHOD

(71) Applicant: SEMES CO., LTD., Cheonan-si (KR)

(72) Inventors: Jung Suk Goh, Hwaseong-si (KR); Kuk Saeng Kim, Yongin-si (KR); Do-Youn Lim, Hwaseong-si (KR); Wan Hee Jeong, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 581 days.

(21) Appl. No.: 17/702,088

(22) Filed: Mar. 23, 2022

(65) Prior Publication Data

US 2023/0311028 A1    Oct. 5, 2023

(51) Int. Cl.
*B01D 21/28* (2006.01)
*B01D 19/00* (2006.01)
(Continued)

(52) U.S. Cl.
CPC ....... *B01D 21/283* (2013.01); *B01D 19/0031* (2013.01); *B01D 19/0078* (2013.01);
(Continued)

(58) Field of Classification Search
CPC .. B01D 21/283; B01D 21/0012; B01D 21/34; B01D 35/02; B01D 35/06; B01D 36/001;
(Continued)

(56) References Cited

U.S. PATENT DOCUMENTS

2009/0251672 A1* 10/2009 Nagasaka ........... G03F 7/70716
355/30
2014/0370439 A1    12/2014 Hollis et al.

FOREIGN PATENT DOCUMENTS

CN    113745128 A  * 12/2021 ........... B05B 1/3405
JP    H02281727 A    11/1990
(Continued)

OTHER PUBLICATIONS

Tsochatzidis et. al. "Determination of velocity, size and concentration of ultrasonic cavitation bubbles by the phase-doppler technique". Chemical Engineering Science 56 p. 1831-1840 (Year: 2001).*

(Continued)

*Primary Examiner* — Liam Royce
(74) *Attorney, Agent, or Firm* — Harness, Dickey & Pierce, P.L.C.

(57) ABSTRACT

The present invention provides a liquid supplying unit, including: a nozzle; a liquid supply pipe configured to supply a treatment liquid to the nozzle; and an impurity removing unit installed in the liquid supply pipe to remove an impurity in the treatment liquid, in which the impurity removing unit includes: a measuring unit configured to measure a characteristic of the impurity in the treatment liquid and form impurity data; a vibrating unit configured to apply vibration to the treatment liquid; a capturing unit configured to adsorb the impurity in the treatment liquid to which the vibration is applied; and a control unit configured to control the measuring unit and the vibration unit, and when the impurity data exceeds a reference data range, the control unit operates the vibrating unit.

14 Claims, 12 Drawing Sheets

(51) Int. Cl.
    *B01D 21/00* (2006.01)
    *B01D 21/34* (2006.01)
    *B01D 35/02* (2006.01)
    *B01D 35/06* (2006.01)
    *B01D 36/00* (2006.01)
    *H01L 21/67* (2006.01)

(52) U.S. Cl.
    CPC ......... *B01D 21/0012* (2013.01); *B01D 21/34* (2013.01); *B01D 35/02* (2013.01); *B01D 35/06* (2013.01); *B01D 36/001* (2013.01); *H01L 21/67051* (2013.01)

(58) Field of Classification Search
    CPC ............ B01D 19/0031; B01D 19/0078; H01L 21/67051
    See application file for complete search history.

(56) References Cited

FOREIGN PATENT DOCUMENTS

| | | |
|---|---|---|
| JP | H10-76213 A | 3/1998 |
| JP | 2001-121063 A | 5/2001 |
| JP | 2003-251336 A | 9/2003 |
| JP | 2005-136186 A | 5/2005 |
| JP | 2017-033991 A | 2/2017 |
| JP | 2019009215 A * | 1/2019 |
| KR | 100598918 B1 | 7/2006 |
| KR | 100827481 B1 | 5/2008 |
| KR | 100868364 B1 | 11/2008 |
| KR | 10-2011-0052768 A | 5/2011 |
| KR | 10-2016-0023290 A | 3/2016 |
| KR | 10-2016-0094494 A | 8/2016 |
| KR | 10-2019-0032801 A | 3/2019 |
| KR | 10-2020-0039068 A | 4/2020 |
| KR | 102125598 B1 | 6/2020 |
| KR | 102298084 B1 | 9/2021 |

OTHER PUBLICATIONS

Office Action for Japanese Application No. 2022-043630 dated Feb. 21, 2023.

Notice of Allowance dated Oct. 21, 2022 issued in corresponding Korean patent application No. 10-2020-0138469.

* cited by examiner

LIQUID SUPPLYING UNIT AND LIQUID SUPPLYING METHOD

TECHNICAL FIELD

The present invention relates to a liquid supplying unit and a liquid supplying method using the same.

BACKGROUND ART

In order to manufacture a semiconductor device or a liquid crystal display, various processes, such as photography, etching, ashing, ion implantation, thin film deposition, and cleaning, are performed on a substrate. Among them, in the photography, etching, ashing, and cleaning processes, a liquid treating process supplying a liquid onto the substrate is performed.

In general, the liquid treating process is a process for liquid-treating the substrate by discharging a treatment liquid from a nozzle. When the treatment liquid is supplied to the substrate in the liquid treating process, impurities are generated from a liquid supply pipe, a liquid storage container, and the nozzle that supply the treatment liquid and flow into the substrate. Therefore, the impurities are removed by installing a filter in the liquid supply pipe.

However, there is a limit in a size of the impurity that can be filtered by the filter, so there is a problem in that fine impurities are supplied to the substrate without being filtered by the filter.

SUMMARY OF THE INVENTION

The present invention has been made in an effort to remove impurities within a liquid supply pipe.

The object of the present invention is not limited thereto, and other objects not mentioned will be clearly understood by those of ordinary skill in the art from the following description.

An exemplary embodiment of the present invention provides a liquid supplying unit, including: a nozzle; a liquid supply pipe configured to supply a treatment liquid to the nozzle; and an impurity removing unit installed in the liquid supply pipe to remove an impurity in the treatment liquid, in which the impurity removing unit includes: a measuring unit configured to measure a characteristic of the impurity in the treatment liquid and form impurity data; a vibrating unit configured to apply vibration to the treatment liquid; a capturing unit configured to adsorb the impurity in the treatment liquid to which the vibration is applied; and a control unit configured to control the measuring unit and the vibration unit, and when the impurity data exceeds a reference data range, the control unit operates the vibrating unit.

In the exemplary embodiment, the control unit may determine a vibration frequency of the vibrating unit based on the characteristic of the impurity measured in the measuring unit.

In the exemplary embodiment, the vibration frequency may be a frequency at which the impurity in the treatment liquid is adsorbed to bubble in the treatment liquid.

In the exemplary embodiment, the vibration frequency may be provided by overlapping a plurality of frequencies.

In the exemplary embodiment, the measuring unit and the vibrating unit may be adjacently provided.

In the exemplary embodiment, vibrating unit and the capturing unit may be adjacently provided.

In the exemplary embodiment, the measuring unit may include a photographing member which photographs a state of the impurity and forms the impurity data.

In the exemplary embodiment, the measuring unit may include a wire mesh provided in a form of a mesh on a surface perpendicular to a flow direction of the treatment liquid within the liquid supply pipe, and the wire mesh may measure electrical conductivity of the wire mesh and form the impurity data.

In the exemplary embodiment, the measuring unit may include a speed measuring device which measures a movement speed of the impurity within the liquid supply pipe and forms the impurity data.

In the exemplary embodiment, the vibrating unit may include any one of a coil motor, a magnetostrictive actuator, and a piezoelectric element.

In the exemplary embodiment, the capturing unit may be made of a porous material.

In the exemplary embodiment, the capturing unit may be provided as an electric field generating device.

In the exemplary embodiment, the capturing unit may further include: a collecting pipe connected to an upper portion of the liquid supply pipe; and a decompressing member for providing negative pressure into the collection pipe, and the control unit may operate the vibrating unit and the decompressing member when the impurity data exceeds a reference data range.

In the exemplary embodiment, the characteristic of the impurity may include at least one of presence or absence of the impurity, a size of the impurity, and a density of the impurity in the treatment liquid.

Another exemplary embodiment of the present invention provides a method of supplying a liquid, the method including: treating a substrate by supplying a treatment liquid onto the substrate, in which a characteristic of an impurity in the treatment liquid is measured to form impurity data, and when the impurity data exceeds a reference data range, the impurity in the treatment liquid and bubble in the treatment liquid are adsorbed by applying vibration to the treatment liquid, and then the impurity adsorbed to the bubble in the treatment liquid is captured before the treatment liquid is supplied to the substrate.

In the exemplary embodiment, a vibration frequency applied to the treatment liquid may be a frequency at which the impurity is adsorbed to the bubble in the treatment liquid.

In the exemplary embodiment, a vibration frequency applied to the treatment liquid may be provided by overlapping a plurality of frequencies.

In the exemplary embodiment, the characteristic of the impurity may include at least one of presence or absence of the impurity, a size of the impurity, and a density of the impurity in the treatment liquid.

Another exemplary embodiment of the present invention provides a method of supplying a liquid by using a liquid supplying unit, the method including: treating a substrate by supplying a treatment liquid onto the substrate by using a liquid supplying unit, in which wherein a measuring unit measures a characteristic of an impurity in the treatment liquid to form impurity data, and when the impurity data exceeds a reference data range, a vibrating unit adsorbs the impurity in the treatment liquid and bubble in the treatment liquid by applying vibration to the treatment liquid, and then a capturing unit captures the impurity adsorbed to the bubble in the treatment liquid before the treatment liquid is supplied to the substrate, the vibration frequency applied to the treatment liquid is a frequency at which the impurity is adsorbed to the bubble in the treatment liquid, and the characteristic of the impurity includes at least one of the presence or absence of the impurity, a size of the impurity, and a density of the impurity in the treatment liquid.

In the exemplary embodiment, the treatment liquid may include a photosensitive liquid.

According to the exemplary embodiment of the present invention, there is an advantage in that it is possible to remove impurities within a liquid supply pipe.

The effect of the present invention is not limited to the foregoing effects, and those skilled in the art may clearly understand non-mentioned effects from the present specification and the accompanying drawings.

DETAILED DESCRIPTION

Figure 1:
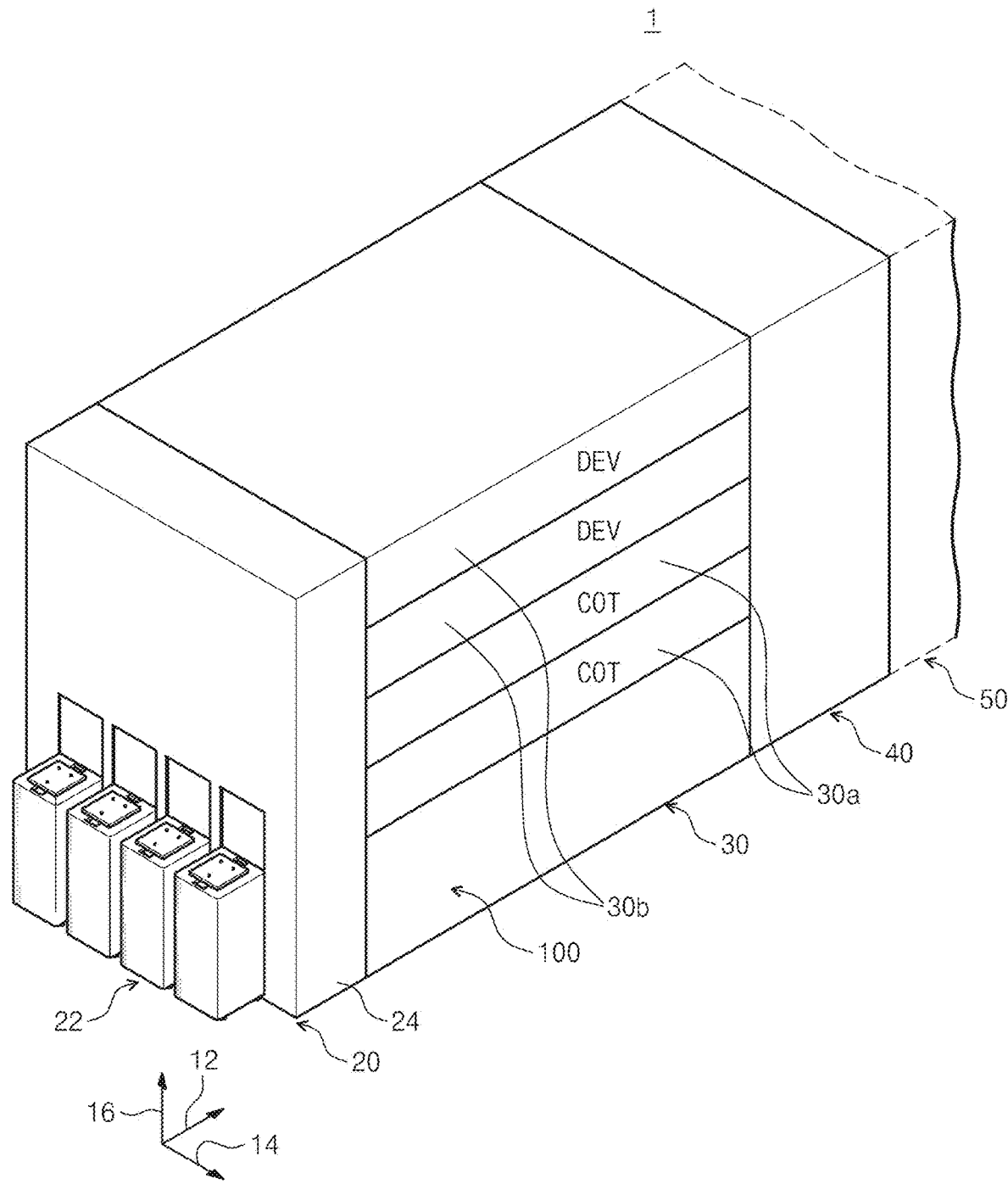
FIG. 1 is a perspective view schematically illustrating a substrate treating apparatus according to an exemplary embodiment of the present invention.

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Therefore, the shapes of elements in the drawings are exaggerated to emphasize a clearer description.

Figure 2:
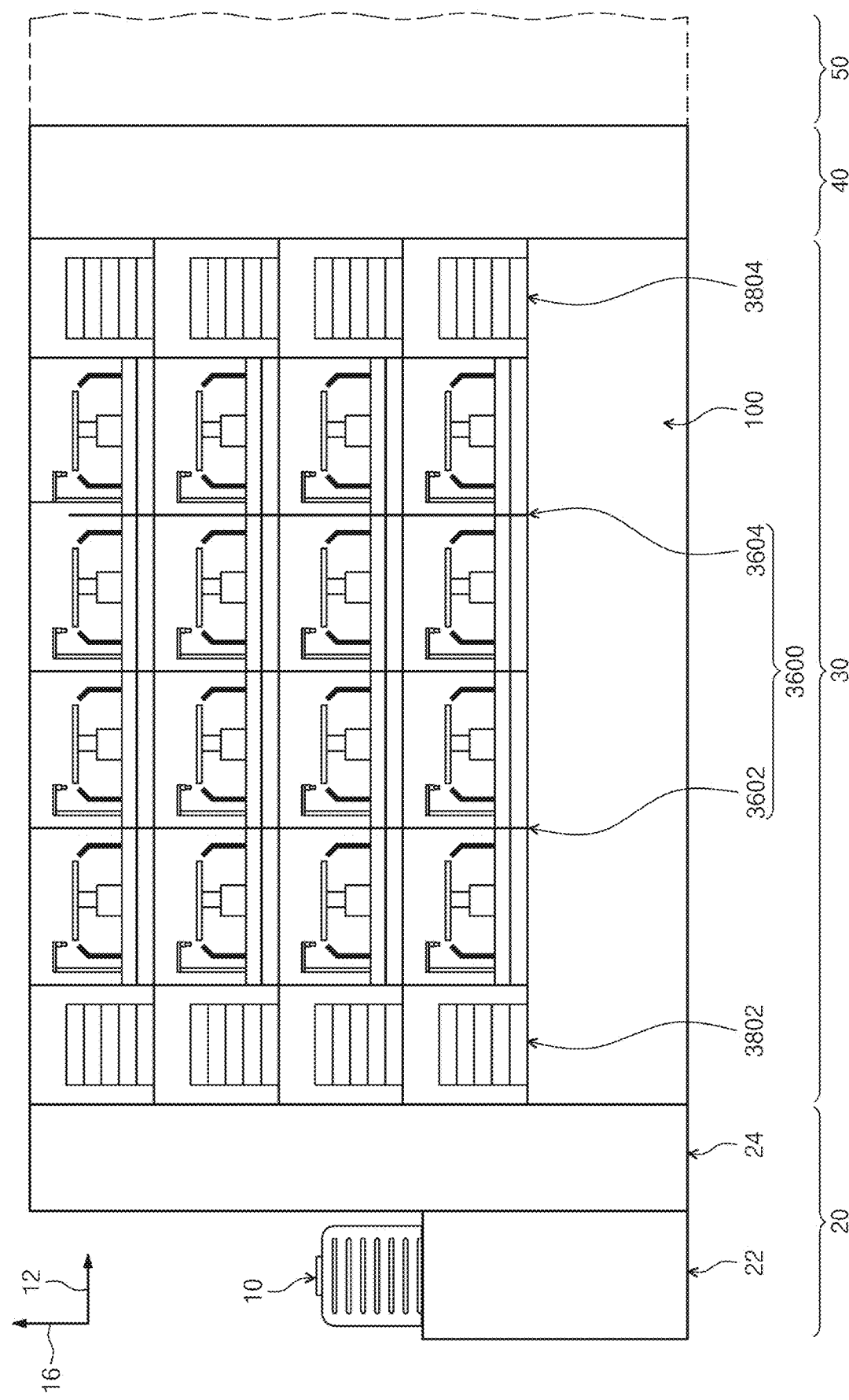
FIG. 2 is a cross-sectional view of the substrate treating apparatus illustrating an applying block or a developing block of FIG. 1.
Figure 3:
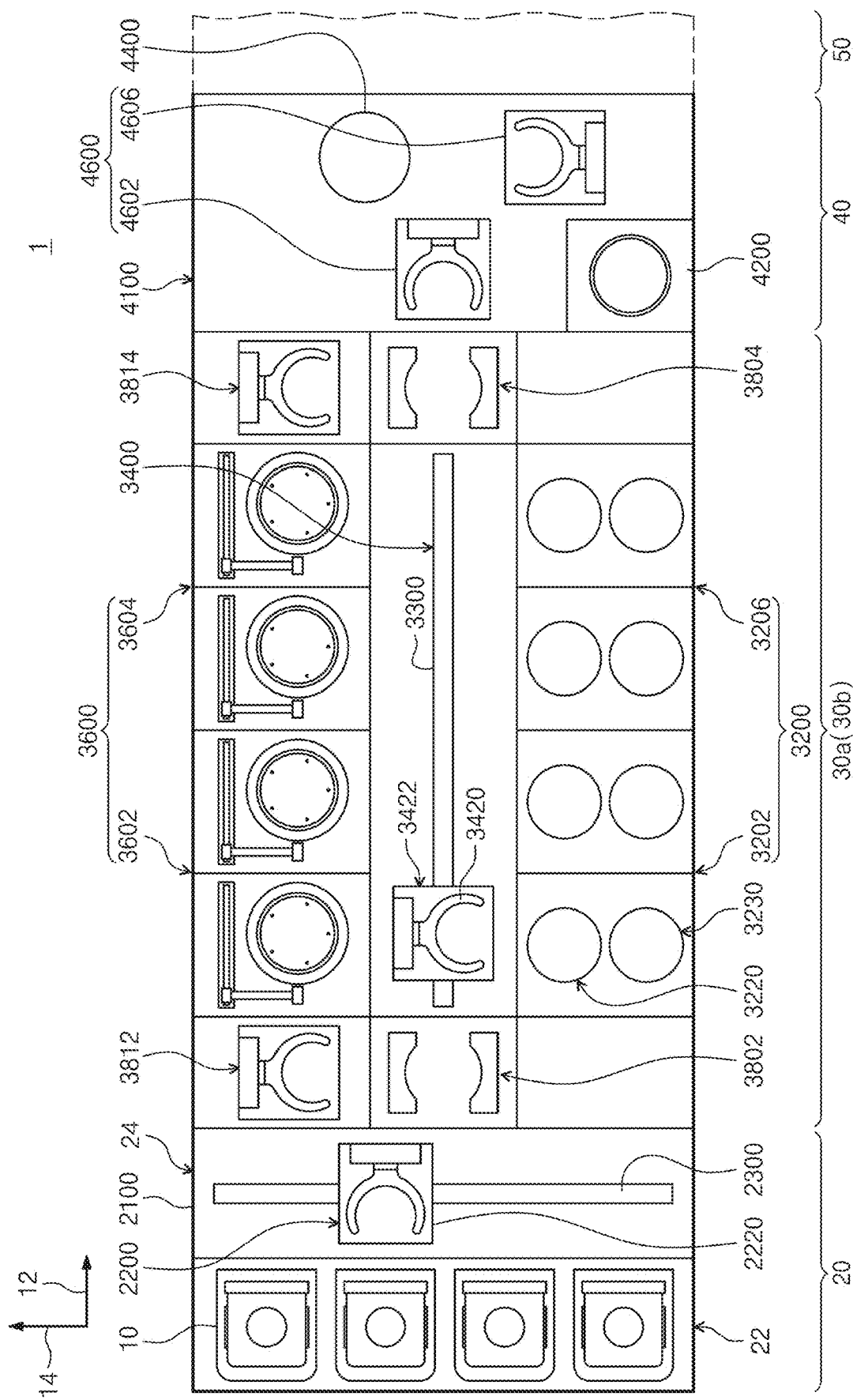
FIG. 3 is a top plan view of the substrate treating apparatus of FIG. 1.

FIG. 1 is a perspective view schematically illustrating a substrate treating apparatus according to an exemplary embodiment of the present invention, FIG. 2 is a cross-sectional view of the substrate treating apparatus illustrating an applying block or a developing block of FIG. 1, and FIG. 3 is a top plan view of the substrate treating apparatus of FIG. 1.

Referring to FIGS. 1 to 3, a substrate treating apparatus 1 includes an index module 20, a treating module 30, and an interface module 40. According to the exemplary embodiment, the index module 20, the treating module 30, and the interface module 40 may be sequentially arranged in series. Hereinafter, a direction in which the index module 20, the treating module 30, and the interface module 40 are arranged is referred to as a first direction 12, and a direction perpendicular to the first direction 12 when viewed from above is referred to as a second direction 14, and a direction perpendicular to both the first direction 12 and the second direction 14 is referred to as a third direction 16.

The index module 20 carries a substrate W from a vessel 10 in which the www is accommodated to the treating module 30, and accommodates the www of which the treatment is completed in the vessel 10. A longitudinal direction of the index module 20 is provided in the second direction 14. The index module includes a load port 22 and an index frame 24. Based on the index frame 24, the load port 22 is located at a side opposite to the treating module 30. The vessel 10 in which the substrates W are accommodated is placed on the load port 22. A plurality of load ports 22 may be provided, and the plurality of load ports 22 may be arranged in the second direction.

As the vessel 10, an airtight vessel 10, such as a Front Open Unified Pod (FOUP), may be used. The vessel 10 may be placed on the load port 22 by a transfer means (not illustrated), such as an overhead transfer, an overhead conveyor, or an automatic guided vehicle, or an operator.

An index robot 2200 is provided inside the index frame 24. A guide rail 2300 of which a longitudinal direction is provided in the second direction 14 is provided within the index frame 24, and the index robot 2200 may be provided to be movable on the guide rail 2300. The index robot 2200 includes a hand 2220 on which the www is placed, and the hand 2220 may be provided to be movable forwardly and backwardly, rotatable about the third direction 16, and movable in the third direction 16.

The treating module 30 performs an application process and a developing process on the www. The treating module 30 includes an applying block 30a and a developing block 30b. The applying block 30a performs an application process on the www, and the developing block 30b performs a developing process on the www. A plurality of applying blocks 30a is provided, and is provided to be stacked on each other. A plurality of developing blocks 30b is provided, and the developing blocks 30b is provided to be stacked on each other. According to the exemplary embodiment of FIG. 1, two applying blocks 30a are provided, and two developing blocks 30b are provided. The applying blocks 30a may be disposed under the developing blocks 30b. According to an exemplary embodiment, two applying blocks 30a may perform the same process and may be provided in the same structure. Further, two developing blocks 30b may perform the same process and may be provided in the same structure.

Referring to FIG. 3, the applying block 30a includes a heat treating chamber 3200, a carrying chamber 3400, a liquid treating chamber 3600, and a buffer chamber 3800. The heat treating chamber 3200 performs a heat treating process on the www. The heat treating process may include a cooling process and a heating process. The liquid treating chamber 3600 formed a liquid film by supplying a liquid onto the www. The liquid film may be a photoresist film or an anti-reflective film. The carrying chamber 3400 carries the www between the heat treating chamber 3200 and the liquid treating chamber 3600 within the applying block 30a.

The carrying chamber 3400 is provided so that a longitudinal direction thereof is parallel to the first direction 12. The carrying robot 3422 is provided to the carrying chamber 3400. The carrying robot 3422 carries the substrate between the heat treating chamber 3200, the liquid treating chamber 3600, and the buffer chamber 3800. According to one example, the carrying robot 3422 has a hand 3420 on which the www is placed, and the hand 3420 may be provided to be movable forwardly and backwardly, rotatable based on the third direction 16, and movable in the third direction 16. A guide rail 3300, of which a longitudinal direction is parallel to the first direction 12, is provided within the carrying chamber 3400, and the carrying robot 3422 may be provided to be movable on the guide rail 3300.

A plurality of heat treating chambers 3202 is provided. The heat treating chambers 3202 are arranged in the first direction 12. The heat treating chambers 3202 are positioned at one side of the carrying chamber 3400.

A plurality of liquid treating chambers 3600 is provided. Some of the liquid treating chambers 3600 may be provided to be stacked on each other. The liquid treating chambers 3600 are disposed at one side of the carrying chamber 3402. The liquid treating chambers 3600 are arranged side by side in the first direction 12. A part of the liquid treating chambers 3600 are provided at locations adjacent to the index module 20. Hereinafter, the liquid treating chambers are called the front liquid treating chambers 3602. Another part of the liquid treating chambers 3600 is provided at positions adjacent to the index module 40. Hereinafter, the foregoing liquid treating chambers are called the rear liquid treating chambers 3604.

The front liquid treating chamber 3602 applies a first liquid onto the www, and the rear liquid treating chamber 3604 applies a second liquid onto the www. The first liquid and the second liquid may be different types of liquid. According to the exemplary embodiment, the first liquid is an anti-reflective film and the second liquid is a photoresist. The photoresist may be applied onto the www coated with the anti-reflective film. Optionally, the first liquid may be a photoresist and the second liquid may be an anti-reflective film. In this case, the anti-reflective film may be applied onto the www coated with the photoresist. Optionally, the first liquid and the second liquid are the same type of liquid, and both the first liquid and the second liquid may be the photoresist.

Figure 4:
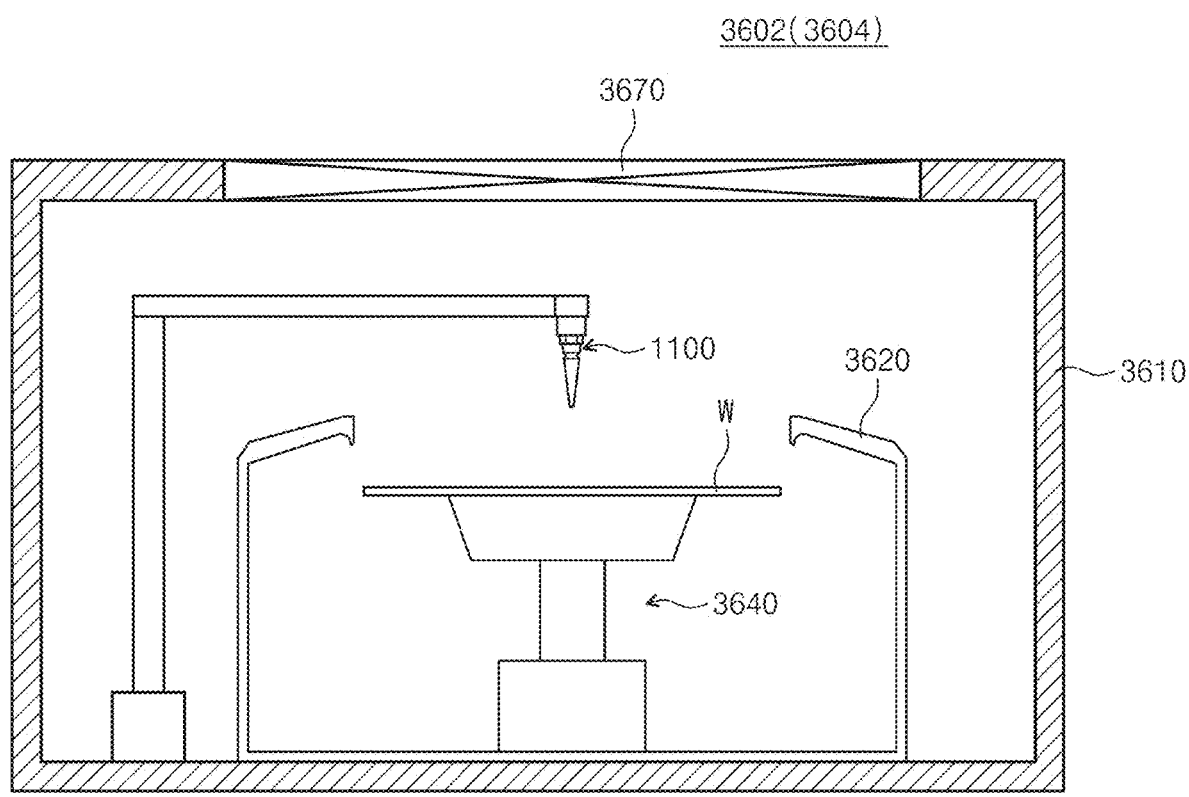
FIG. 4 is a diagram schematically illustrating an example of a liquid treating chamber of FIG. 3.

FIG. 4 is a diagram schematically illustrating an example of the liquid treating chamber of FIG. 3. Referring to FIG. 4, the liquid treating chamber 3600 includes a housing 3610, a cup 3620, a substrate support unit 3640, and a nozzle 1100. The housing 3610 is provided in the shape of a generally rectangular parallelepiped. An inlet (not illustrated) through which the www enters and exits is formed on a lateral wall of the housing 3610. The inlet may be opened/closed by a door (not illustrated). The cup 3620, the support unit 3640, and the nozzle 1100 are provided within the housing 3610. A fan filter unit 3670 forming a downdraft within the housing 3620 may be provided in an upper wall of the housing 3610. The cup 3620 has a treatment space of which a top portion is opened. The substrate support unit 3640 is disposed within the treatment space and supports the substrate W. The substrate support unit 3640 is provided so that the www is rotatable during the liquid treatment. The nozzle 1100 supplies the treatment liquid to the www supported by the substrate support unit 3640. In one example, the treatment liquid contains a photosensitive liquid.

Figure 5:
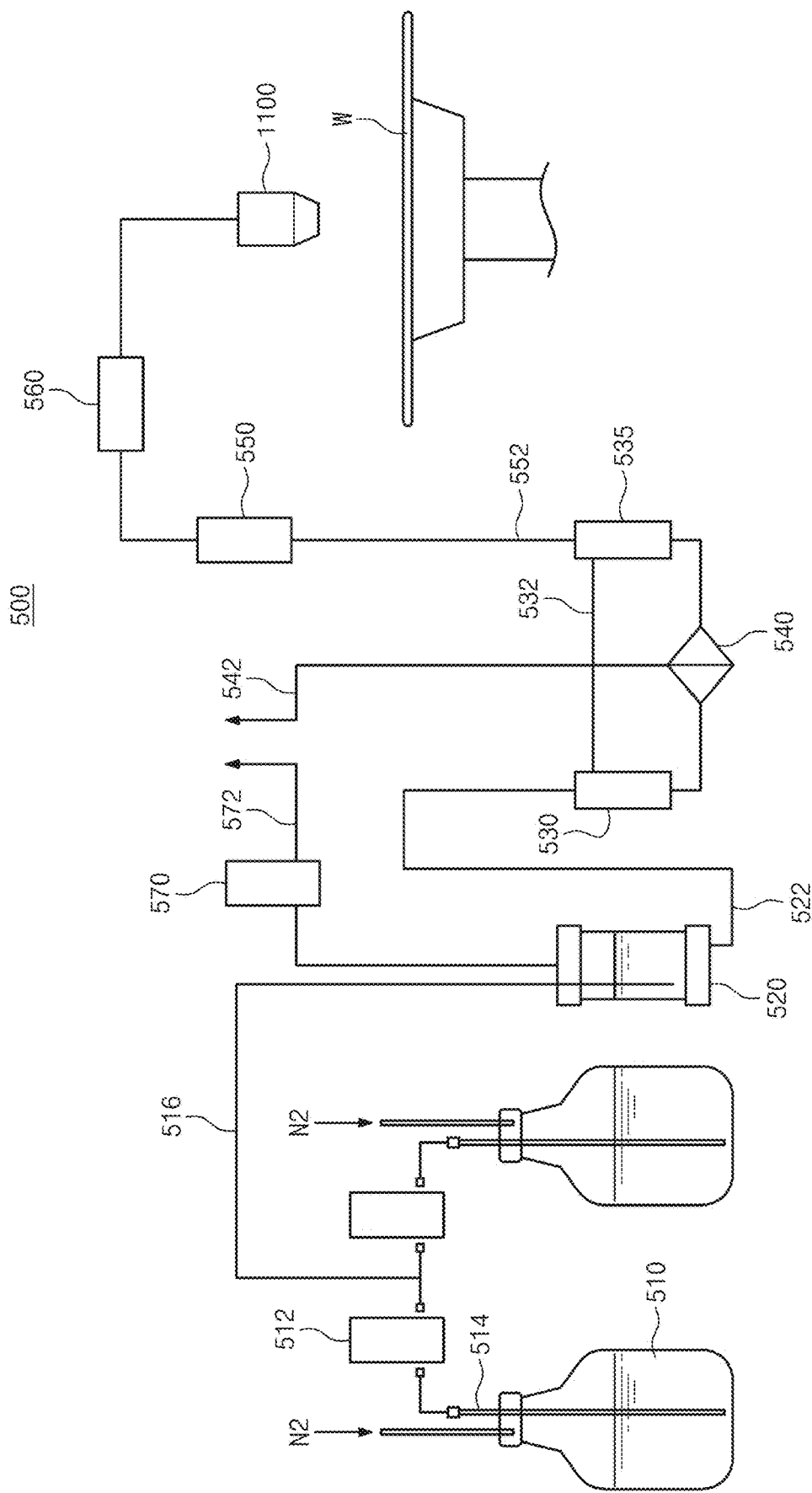
FIG. 5 is a diagram illustrating a liquid supplying unit according to the exemplary embodiment of the present invention.

FIG. 5 is a diagram illustrating the liquid supplying unit 500 according to the exemplary embodiment of the present invention. Hereinafter, the present invention will be described based on the case where the liquid supplying unit 500 supplies the treatment liquid to the nozzle 110 within the liquid treating chambers 3602 and 3604.

The liquid supplying unit 500 according to the present invention may be used for supplying the treatment liquid to the substrate. Herein, the substrate includes a semiconductor substrate, such as a silicon wafer, for a semiconductor device. However, the substrate is not limited to the substrate for the semiconductor device, and may be a substrate for manufacturing a display panel provided in a flat-panel display device, as a large-area flat-panel substrate made of a glass material or a quartz material.

Referring to FIG. 5, the liquid supplying unit 500 according to the present invention includes a storage vessel 510, a trap tank 520, a pump, a filter 540, a suck back valve, a flow meter, and an impurity removing unit 600.

A treatment liquid is stored in the storage vessel 510. In one example, the treatment liquid is a photosensitive liquid. For example, the treatment liquid is a photoresist. In one example, the storage vessel 510 may be provided in a form of a bottle. In one example, two storage vessels 510 may be provided. The respective storage vessels 510 are connected through a connection line 514. A first valve 512, which adjusts whether to supply the treatment liquid supplied from the storage vessel 510 to the trap tank 520 and adjust a supply flow rate, may be provided above the storage vessel 510. The storage vessel 510 may be connected with a gas supply source (not illustrated) for supply nitrogen gas ($N_2$) with a predetermined pressure. For example, the storage vessel 510 has a sealable structure, and a gas supply line through which nitrogen gas ($N_2$) is transferred from the gas supply source (not illustrated) is detachably connected to the storage vessel 510. Accordingly, a surface region of the treatment liquid stored in the storage vessel 510 is pressurized by the supply pressure of the nitrogen gas ($N_2$) according to the supply of the nitrogen gas ($N_2$) to the upper portion of the vessel in the sealed environment, so that the treatment liquid moves to the first supply line 516.

The photoresist received through the first supply line 516 is stored in the trap tank 520, and water level detecting sensors (not illustrated) are installed at one side of the trap tank 520 to detect the level of the photoresist and make the photoresist be continuously filled to an appropriate level. A first drain line 572 is connected to an upper end of the trap tank 520 to remove air bubbles collected to the upper end of the trap tank 520 or passively drains the photoresist in response to the change in the property of the photoresist. A drain valve 570 for adjusting air bubbles drained to the first drain line 572 or a flow rate of the treatment liquid is installed in the first drain line 572.

The trap tank 520 is connected with a suction pump 530 through a second supply line 522. The suction pump 530 sucks the photoresist within the trap tank 520 and transfers the sucked photoresist to a discharge pump 535. In one example, the suction pump 530 may be provided as a diaphragm pump that is one of the reciprocating pumps. The filter 540 is installed in a third line 532 that connects the suction pump 530 and the discharge pump 535. The filter 540 filters impurities within the treatment liquid supplied from the suction pump 530 to the discharge pump 535. Further, a second drain line 542 may be connected to the filter 540 so as to discharge air bubbles filled in the filter 540.

In one example, the second drain line 542 is connected to an upper region of the filter 540.

The discharge pump 535 is connected with the nozzle 110 by the liquid supply line 552. The suck back valve 550 and a flowmeter 560 are installed in the liquid supply line 552. The suck back valve 550 prevents the treatment liquid supplied to the nozzle 1100 from flowing backward. The flowmeter 560 adjusts the flow rate of the treatment liquid supplied to the nozzle 1100.

The impurity removing unit 600 of the present invention may be provided to a front end or a rear end of the configuration, such as the suction pump 530, the discharge pump 535, the filter 540, the valve, and the flowmeter 560. In one example, the impurity removing unit 600 of the present invention may be provided at a location adjacent to the nozzle 1100 of the liquid supply line 552. Hereinafter, it will be described that the impurity removing unit 600 is provided to a liquid supply pipe 555 provided as a pipe of the liquid supply line 552.

Hereinafter, the impurity P removing unit 600 of the present invention will be described with reference to FIGS. 6 to 13.

Figure 6:
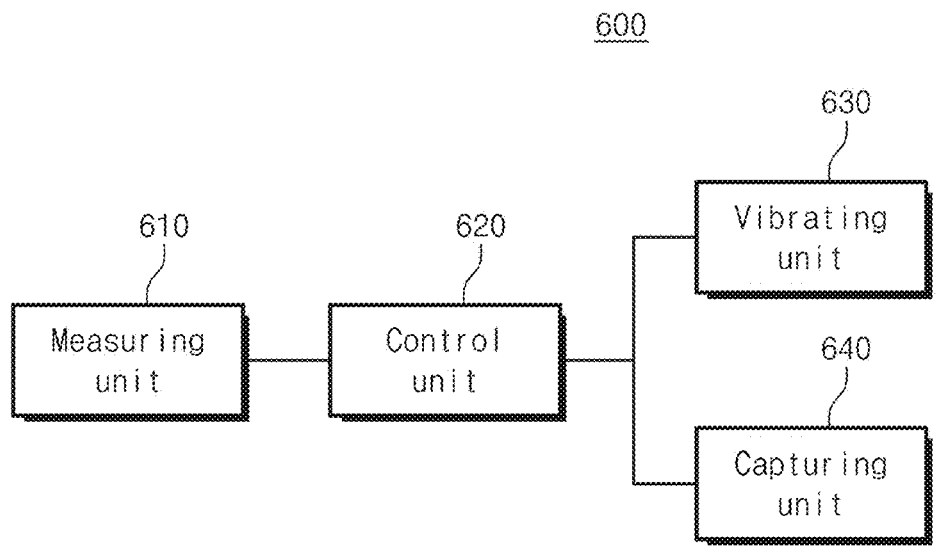
FIG. 6 is a diagram illustrating a configuration of an impurity removing unit according to the exemplary embodiment of the present invention.
Figure 7:
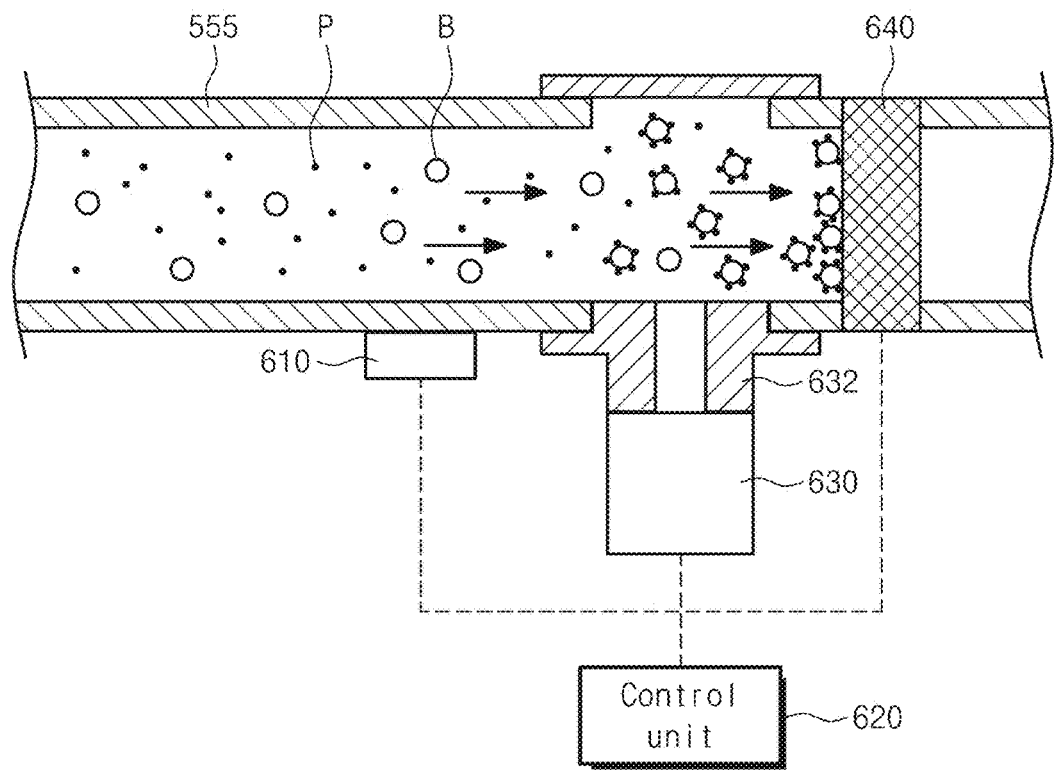
FIG. 7 is a diagram illustrating the state where the impurity removing unit is provided to a liquid supply pipe according to the exemplary embodiment of the present invention.
Figure 8:
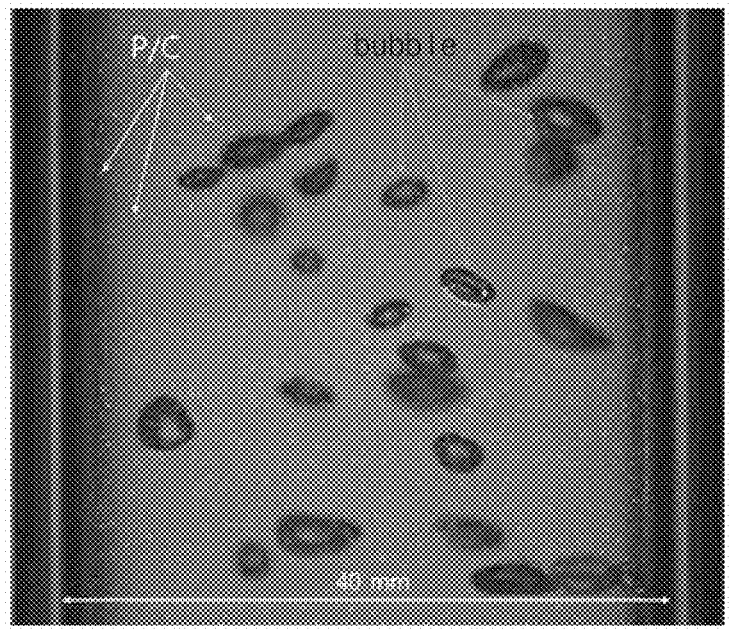
FIG. 8 is a diagram illustrating the state where a measurement unit visualizes the inside of the liquid supply pipe according to the exemplary embodiment of the present invention.

Referring to FIGS. 6 and 7, the impurity P removing unit 600 includes a measuring unit 610, a vibrating unit 630, a capturing unit 640, and a control unit 620. The measuring unit 610 measures a characteristic of the impurity P within the treatment liquid and forms impurity P data. In one example, the characteristic of the impurity P may be at least one of the presence or absence of the impurity P, a size of the impurity P, and a density of the impurity P in the treatment liquid. In one example, the measuring unit 610 may be provided as a photographing member. The photographing member photographs a state of the impurity P and forms the impurity P data. In one example, the photographing member visualizes the impurity P within the liquid supply pipe 555 and forms the impurity P data as illustrated in FIG. 8. For example, the photographing member measures the size and the amount of impurity P. Further, the photographing member may measure the degree of adsorption between the impurity P and the bubbles B existing within the treatment liquid.

Figure 9:
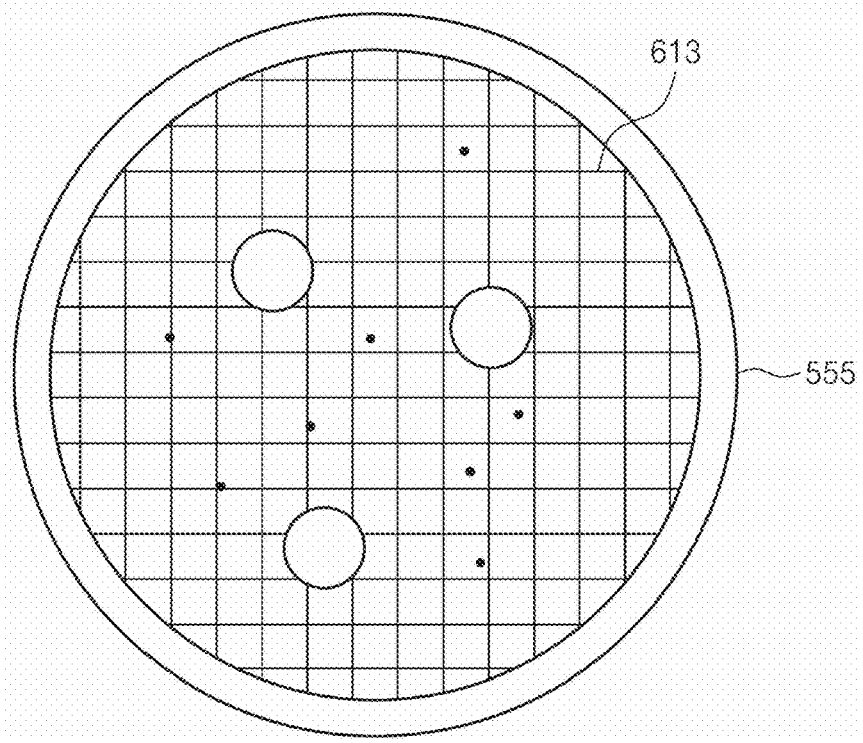
FIG. 9 is a diagram illustrating the measurement unit according to the exemplary embodiment of the present invention.

In one example, the measuring unit 610 may be provided as a wire mesh 613 as illustrated in FIG. 9. The wire mesh 613 is provided in the form of a mesh on a surface perpendicular to a flow direction of the treatment liquid within the liquid supplying unit 555. The wire mesh 613 measures electrical conductivity on the wire mesh 613 and form the impurity P data. For example, the wire mesh 613 continuously measures electrical conductivity on the wire mesh 613. The region to which the impurity P or the bubbles B are attached on the wire mesh 613 has lower electrical conductivity compared to the region to which the impurity P or the bubbles B are not attached. Therefore, the wire mesh 613 may measure whether the impurity P or the bubble B is attached, the size of the impurity P or the bubble B, and the amount of impurities P or the bubbles B per unit area.

In one example, the measuring unit 610 may be provided as a speed measuring device. The speed measuring device measures a movement speed of the impurity P within the liquid supply pipe 555 and forms impurity P data. For example, the measuring device may measure a movement speed of the impurity P by an optical method of visualizing the impurity P within the liquid supply pipe 555 by using a camera, a laser, and the like. Optionally, the measuring device may be provided as a Doppler speed measuring device.

The vibrating unit 630 applies vibrations to the treatment liquid. The capturing unit 640 adsorbs the impurity P within the treatment liquid to which the vibrations are applied. The control unit 620 controls the measuring unit 610 and the vibrating unit 630. In one example, the control unit 620 operates the vibrating unit 630 when the impurity P data exceeds a reference data range. For example, the control unit 620 compares the impurity P data formed by the measuring unit 10 with the reference data range stored in the control unit 620. Before the treatment liquid is supplied to the liquid supplying unit 500, the reference data range is input to the control unit 620. For example, the reference data range is a value in which the amount of impurities P present in the liquid supply pipe 555, the size of the impurity P, and the density of the impurity P within the treatment liquid are within the allowable range. A diameter of the liquid supply pipe 555 in the region to which the vibration is applied by the vibrating unit 630 may be provided to be larger than a diameter of the liquid supply pipe 555 in the region to which the vibration is not applied. In one example, the vibrating unit 630 may be installed outside the liquid supply pipe 555. For example, as illustrated in FIG. 7, a vibration generating device provided to the vibrating unit by a body 632 surrounding the liquid supply pipe 555 may be attached to the liquid supply pipe 555. Optionally, the vibrating unit 630 may be provided within the liquid supply pipe 555.

In one example, a vibration frequency of the vibrating unit 630 is determined based on the characteristic of the impurity P measured in the measuring unit 610. For example, the vibration frequency may be a frequency at which the impurity P within the treatment liquid is adsorbed to the bubble B within the treatment liquid. In one example, the vibration frequency may be provided as a frequency at which the bubble B is not additionally generated within the treatment liquid, and the bubble B already present within the treatment liquid and the impurity P are adsorbed. In one example, the vibration frequency may be provided by overlapping the plurality of frequencies. In one example, the vibration frequency may be determined by the type of treatment liquid, the temperature of the treatment liquid, the flow rate of the treatment liquid, the nature or the amount of charges within the treatment liquid, the material of the liquid supply pipe 555, the size of the impurity P, the type of impurity P, and the like. The foregoing property data has been input to the control unit 620 before the treatment liquid is supplied to the liquid supplying unit 500.

Figure 10:
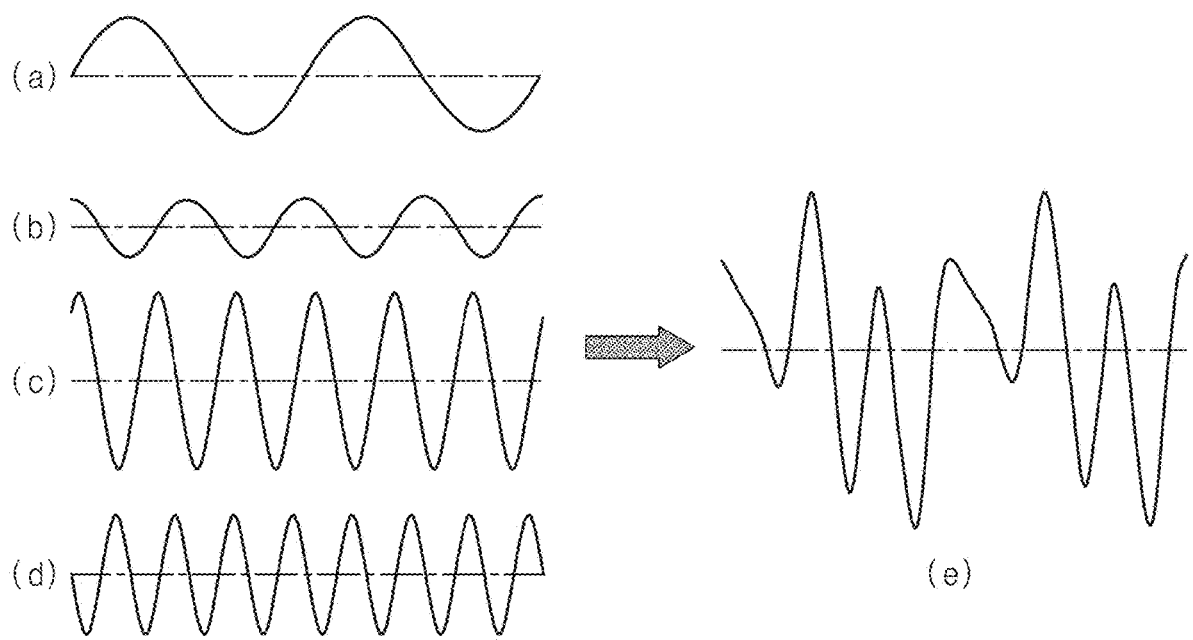
FIG. 10 is a graph illustrating a vibration frequency of a vibrating unit according to the exemplary embodiment of the present invention.

When the vibration is applied to the treatment liquid, Bjerknes Force and drag force are applied between the bubble B and the impurity P within the treatment liquid. When Bjerknes Force by the vibration is larger than drag force, the bubble B and the impurity are adsorbed. The Bjerknes Force is different for each property data. Accordingly, the number of vibrations for adsorbing the bubble B and the impurity P is different depending on the property data. The property data of the impurity P and the bubble B present in the treatment liquid, such as the type and size of impurity P or bubble P, may not be single. Therefore, the vibration frequency may be provided as a plurality of frequencies as illustrated in FIG. 10. For example, when the impurity P adsorbed to the bubble B by the numbers of vibrations (a) to (d) is present in the treatment liquid, a wave having the number of vibrations (e) may be provided by overlapping the waves having the numbers of vibrations (a) to (d). Optionally, the vibration frequency may be provided as a single frequency.

In one example, as the size of the impurity P is small, the density of the impurity P in the treatment liquid is large, and the density of the treatment liquid is low, the higher number of vibrations is required. In one example, the measuring unit 610 and the vibrating unit 630 may be provided in adjacent regions. Optionally, the vibrating unit 630 may be provided in a plurality of regions.

In one example, the vibrating unit 630 may include any one of a coil motor, a magnetostrictive actuator, and a piezoelectric element. In one example, the coil motor applies the vibration to the treatment liquid by using a permanent magnet and the coil installed in the liquid supply pipe 555. The magnetostrictive actuator includes a diaphragm that causes mechanical deformation when an alternating magnetic field is applied. In one example, the diaphragm is attached to the liquid supply pipe 555 to apply vibration to the treatment liquid. The piezoelectric element causes mechanical deformation when a voltage is applied to apply vibration to the treatment liquid. In one example, the vibration is applied to the treatment liquid by attaching the piezoelectric element to the liquid supply pipe 555. Optionally, the vibrating unit 630 may be provided in the form in which any one of the coil motor, the magnetostrictive actuator, and the piezoelectric element generates vibration to a medium and the medium transfers the vibration to the liquid supply pipe 555.

The capturing unit 640 allows the impurity P and the bubble B in the treatment liquid to which the vibration is applied by the vibrating unit 630 to be captured in one region. In one example, the vibrating unit 630 and the capturing unit 640 are sequentially provided in the same direction as the flow of the treatment liquid. Optionally, the vibrating unit 630 and the capturing unit 640 may be provided in the same region of the liquid supply pipe 555.

In one example, as illustrated in FIG. 7, the capturing unit 640 may be made of a porous material. In one example, the capturing unit 640 may be provided to a surface perpendicular to the flow direction of the treatment liquid within the liquid supply pipe 555. A hole formed in the porous material is provided with a size through which the bubble B cannot pass. Therefore, the bubble B and the impurity P adsorbed to the bubble B are captured by the capturing unit 640 and the treatment liquid passing through the capturing unit 640 is in a clean state.

Figure 11:
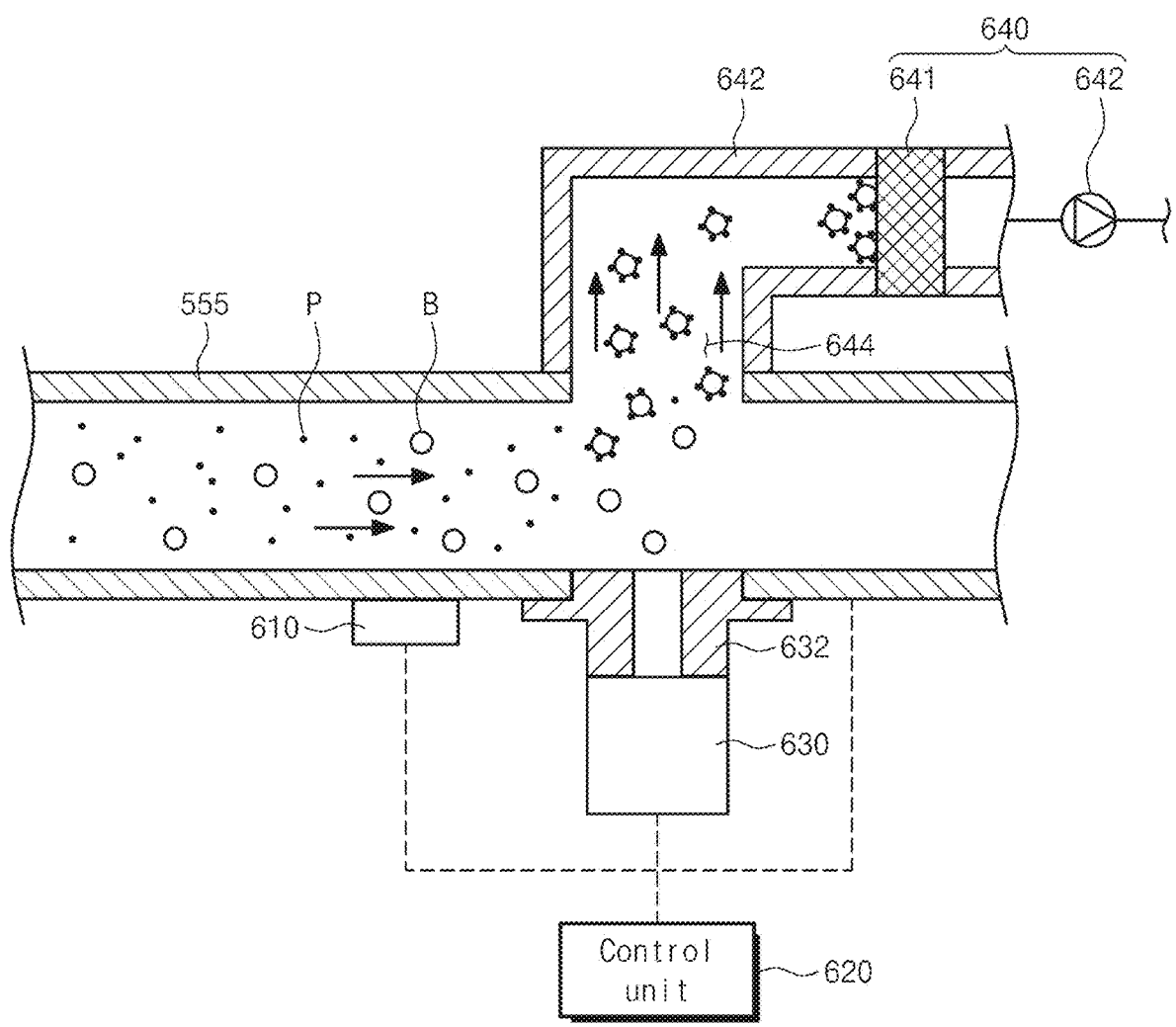
FIGS. 11 to 13 are diagrams illustrating a capturing unit according to the exemplary embodiment of the present invention.

In one example, as illustrated in FIG. 11, the capturing unit 640 may include a collection pipe 644 connected to an upper portion of the liquid supply pipe 555 and a decompressing member 642 providing negative pressure in the collection pipe 644. In one example, the collection pipe 644 forms an empty space in the upper portion of the liquid supply pipe 555. When the impurity P data exceeds the reference data range, the control unit 620 allows the bubble B and the impurity to be discharge from the liquid supply pipe 555 through the collection pipe 644 by operating the vibrating unit 630 and the decompressing member 652. In one example, the capturing unit 640 may have a membrane 641 receiving the reduced pressure from the decompressing member 642.

In one example, the capturing unit 640 may be provided as an electric field generating device. The electric field generating device adsorbs the bubble by electrostatic attraction.

Figure 12:
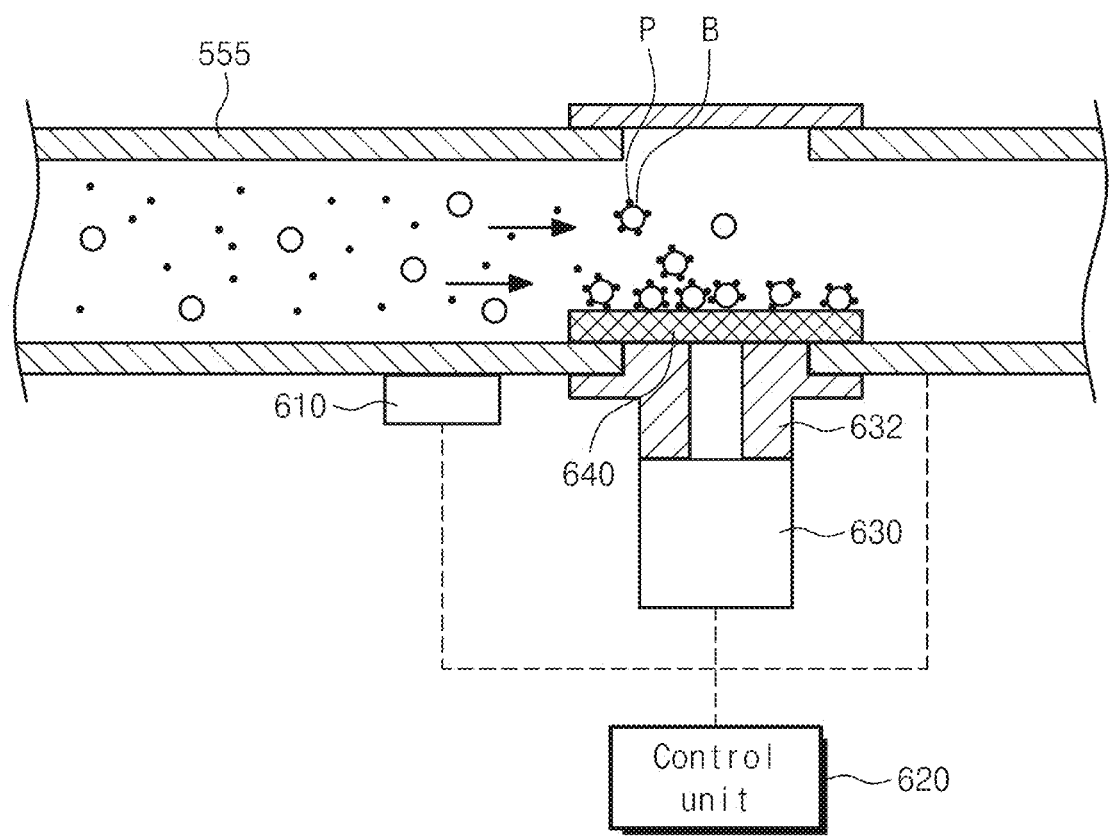
Figure 13:
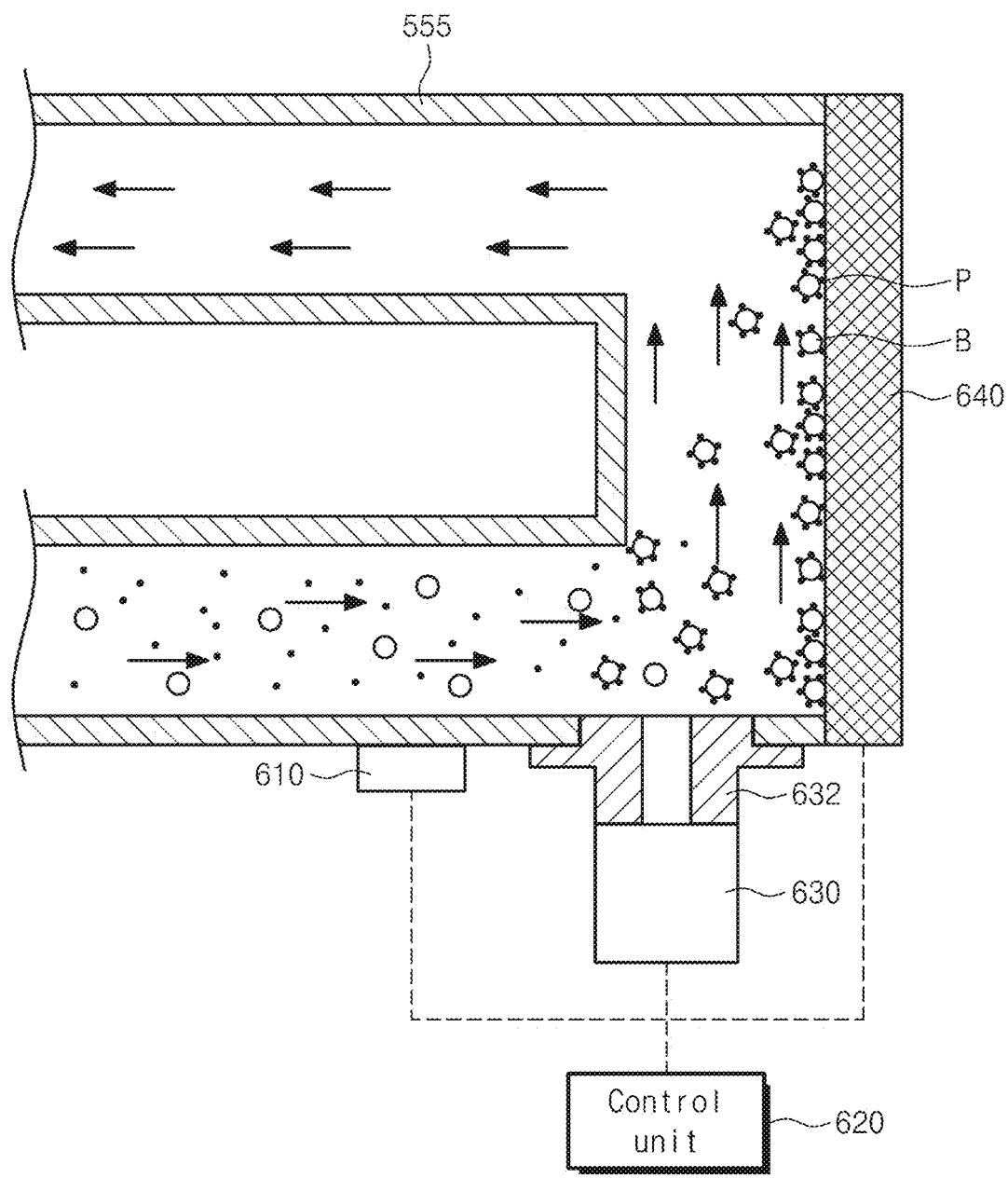

Optionally, the capturing unit 640 is made of a porous material, and the capturing unit 640 is provided to a surface horizontal to the movement direction of the treatment liquid as illustrated in FIG. 12. Accordingly, it is possible to provide a large surface area of the capturing unit 640. Optionally, the capturing unit 640 is made of a porous material, and the capturing unit 640 is provided to be vertical to the movement direction of the treatment liquid. For example, as illustrated in FIG. 13, the direction of the treatment liquid flowing toward the capturing unit 640 is provided to be different from the direction of the treatment liquid passing through the capturing unit 640. Therefore, the bubble B and the impurity P may be effectively captured to the capturing unit 640.

Figure 14:
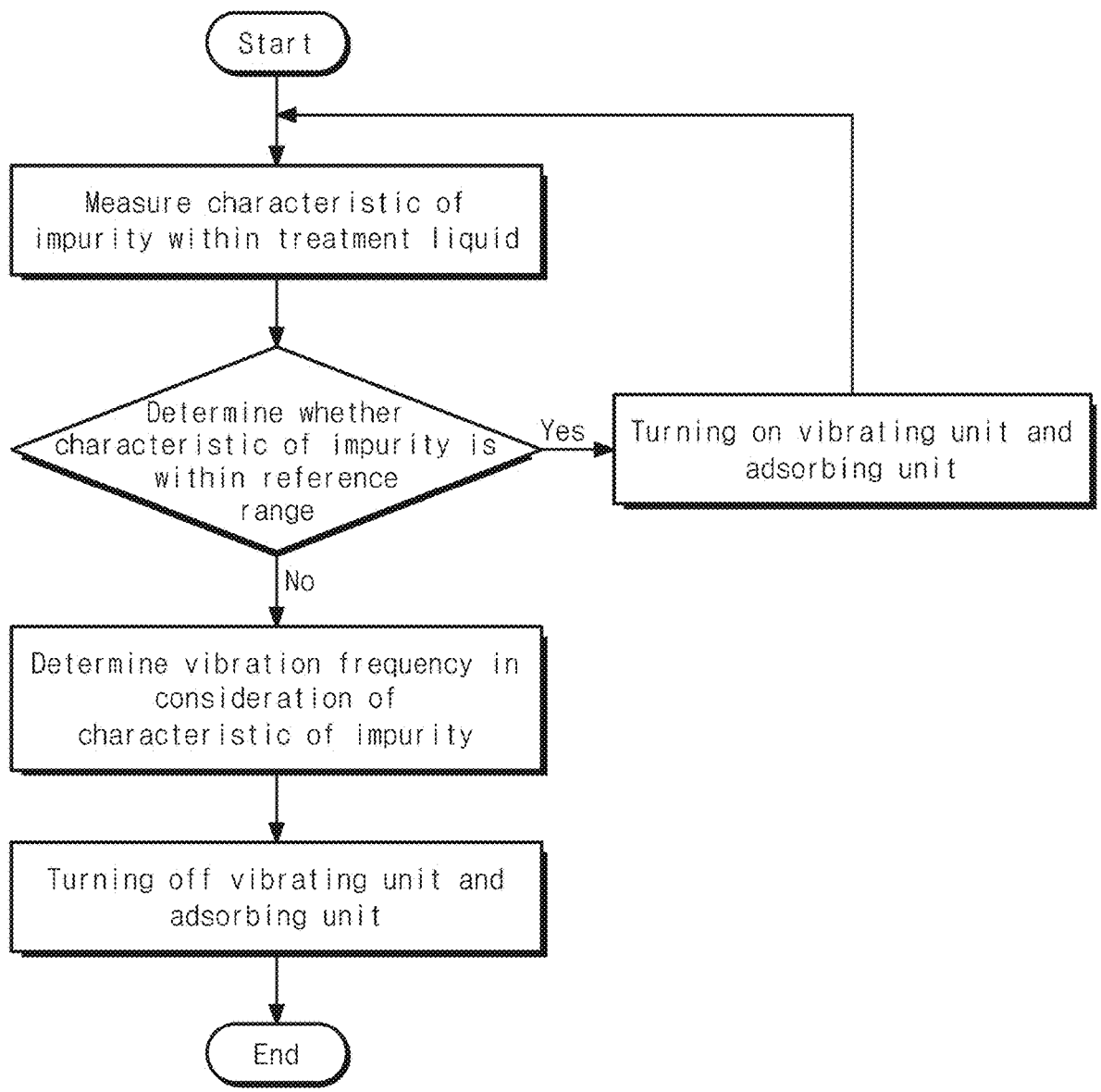
FIG. 14 is a flowchart sequentially illustrating a liquid supplying method according to the exemplary embodiment of the present invention.

FIG. 14 is a flowchart sequentially illustrating a method of supplying a liquid by using the liquid supplying unit 500 of the present invention. When a treatment liquid is supplied to the liquid supply pipe 555, the measuring unit 610 measures a characteristic of the impurity P within the treatment liquid as described above. The measuring unit 610 measures impurity P data based on the characteristic of the impurity P. The control unit 620 determines whether the impurity P data within the treatment liquid is within a reference data range based on the impurity P data. When the impurity P data within the treatment liquid is within the reference data range, the vibrating unit 630 and the adsorbing unit are not operated, and the measuring unit 610 continuously measures the characteristic of the impurity P within the treatment liquid.

When the impurity P data within the treatment liquid is out of the reference data range, the control unit 620 causes the vibrating unit 630 to cause vibration. When the adsorbing unit is made of a porous material, it is not necessary to separately operate the adsorbing unit. When the adsorbing unit includes an electric field generating device or the decompressing member 642, the control unit 620 operates the adsorbing unit together when operating the vibrating unit 630. The control unit 620 determines a vibration frequency of the vibrating unit 630 before the vibrating unit 630 generates vibration. As described above, the vibration frequency is determined by property data input to the control unit 620 based on the characteristic of the impurity P.

In one example, the vibrating unit 630 and the capturing unit 640 may be adjacently provided. In one example, as illustrated in FIG. 7, the measuring unit 610, the vibrating unit 630, and the capturing unit 640 may be adjacently provided. For example, based on a direction in which the treatment liquid is flows, the measuring unit 61 and the vibrating unit 630 may be sequentially provided. Optionally, the vibrating unit 630 may be provided in a measurement region of the measuring unit 610.

According to the present invention, there is an advantage in that it is possible to simultaneously remove the bubble B and the impurity P within the treatment liquid.

According to the present invention, there is an advantage in that it is possible to remove the impurity P without generating the bubble B in the treatment liquid.

According to the present invention, there is an advantage in that it is possible to increase the degree of adsorption of the impurity P and the bubble B by recognizing the characteristic of the impurity P within the treatment liquid and generating the vibrations at the frequency at which the impurity P and the bubble B are adsorbed according to the characteristic of the impurity P.

In the foregoing example, the liquid supplying unit 500 has been described as the unit supplying the photosensitive liquid. However, contrary to this, the liquid supplying unit 500 may also be used in other devices, such as a cleaning device for supplying a liquid, a display device, and an etcher device.

Referring back to FIGS. 2 and 3, a plurality of buffer chambers 3800 is provided. A part of the buffer chambers 3800 is disposed between the index module 20 and the carrying chamber 3400. Hereinafter, the foregoing buffer chambers are referred to as front buffers 3802. A plurality of front buffers 3802 is provided, and is positioned to be stacked on each other in a vertical direction. Another part of the buffer chambers 3802 and 3804 is disposed between the carrying chamber 340 and the interface module 40. Hereinafter, the foregoing buffer chambers are referred to as rear buffers 3804. A plurality of rear buffers 3804 is provided, and is positioned to be stacked on each other in a vertical direction. The front buffers 3802 and the rear buffers 3804 temporarily store the plurality of substrates W, respectively. The www stored in the front buffer 3802 is loaded or unloaded by the index robot 2200 and the carrying robot 3422. The www stored in the rear buffer 3804 is loaded or unloaded by the carrying robot 3422 and a first robot 4602.

The developing block 30*b* includes a heat treatment chamber 3200, a carrying chamber 3400, and a liquid treating chamber 3600. The heat treating chamber 3200 and the carrying chamber 3400 of the developing block 30*b* are provided in generally similar structure and disposition to those of the heat treating chamber 3200 and the carrying chamber 3400 of the applying block 30*a*, so that the description thereof will be omitted. In the developing block 30*b*, all of the liquid treating chambers 3600 supply a developer to the developing chamber 3600 developing the substrate in the same way.

The interface module 40 connects the treating module 30 to an external exposing device 50. The interface module 40 includes an interface frame 4100, an additional processing chamber 4200, an interface buffer 4400, and a carrying member 4600.

A fan filter unit forming downdraft therein may be provided to an upper end of the interface frame 4100. The additional processing chamber 4200, the interface buffer 4400, and the carrying member 4600 are disposed inside the interface frame 4100. The additional processing chamber 4200 may perform a predetermined additional process before the www, which has been completely processed in the applying block 30*a*, is loaded into the exposing device 50. Optionally, the additional processing chamber 420 may perform a predetermined additional process before the www, which has been completely processed in the exposing device 50, is loaded into the developing block 30*b*. According to one example, the additional process may be an edge exposure process for exposing an edge region of the substrate W, a top surface cleaning process for cleaning the upper surface of the substrate W, or a bottom surface cleaning process for cleaning the lower surface of the substrate W. A plurality of additional process chambers 4200 is provided, and may be provided to be stacked on each other. All of the additional process chambers 4200 may be provided to perform the same process. Optionally, a part of the additional process chambers 4200 may be provided to perform different processes.

The interface buffer 4400 provides a space in which the www carried between the applying block 30*a*, the additional processing chamber 4200, the exposing device 50, and the developing block 30*b* are temporarily stayed during the carrying. A plurality of interface buffers 4400 is provided, and the plurality of interface buffers 4400 may be provided to be stacked on each other.

According to one example, based on the longitudinal extension line of the transfer chamber 3400, the additional process chamber 4200 may be disposed on one side, and the interface buffer 4400 may be disposed on the other side.

The carrying member 4600 provides the www between the applying block 30*a*, the additional processing chamber 4200, the exposing device 50, and the developing block 30*b*.

The carrying member 4600 may be provided as one or a plurality of robots. According to one example, the carrying member 4600 includes the first robot 4602 and a second robot 4606. The first robot 4602 may be provided to carry the www between the applying block 30*a*, the additional processing chamber 4200, and the interface buffer 4400, the interface robot 4606 may be provided to carry the www between the interface buffer 4400 and the exposing device 50, and the second robot 4604 may be provided to carry the www between the interface buffer 4400 and the developing block 30*b*.

Each of the first robot 4602 and the second robot 4606 includes a hand on which the www is placed, and the hand may be provided to be movable forwardly and backwardly, rotatable about an axis parallel to the third direction 16, and movable in the third direction 16.

All of the hands of the index robot 2200, the first robot 4602, and the second robot 4604 may be provided in the same shape as that of the hand 3420 of the carrying robot 3422. Optionally, the hand of the robot directly exchanging the www with the carrying plate 3240 of the heat treating chamber may be provided in the same shape as that of the hand 3420 of the carrying robot 3422, and the hands of the remaining robots may be provided in a different shape.

According to the exemplary embodiment, the index robot 2200 is provided to directly exchange the www with the heating unit 3230 of the front heat treating chamber 3200 provided to the applying block 30*a*.

Further, the carrying robots 3422 provided to the applying block 30*a* and the developing block 30*b* may be provided to directly exchange the www with the carrying plate 3240 located in the heat treating chamber 3200.

Next, an exemplary embodiment of a method of treating a substrate by using the substrate treating apparatus 1 will be described. An application process S20, an edge exposure process S40, an exposure process S60, and a developing process S80 are sequentially performed on a substrate W.

The application process S20 is performed by sequentially performing a heat treating process S21 in the heat treating chamber 3200, an anti-reflective film applying process S22 in the front liquid treating chamber 3602, a heat treating process S23 in the heat treating chamber 3200, a photoresistive film applying process S24 in the rear liquid treating chamber 3605, and a heat treating process S25 in the heat treating chamber 3200.

Hereinafter, one example of a carrying path of the www from the vessel 10 to the exposing device 50 will be described. The index robot 2200 takes the www out of the vessel 10 and carries the www to the front buffer 3802. The carrying robot 3422 carries the www stored in the front buffer 3802 to the front heat treating chamber 3200. The www is carried to the heating unit 3230 by the carrying plate 3240. When the heating process of the substrate is completed in the heating unit 3230, the carrying plate 3240 carries the substrate to the cooling unit 3220. The carrying plate 3240 is in contact with the cooling unit 3220 to perform a cooling process of the www in the state of supporting the www. When the cooling process is completed, the carrying plate 3240 moves to the upper part of the cooling unit 3220, and the carrying robot 3422 takes the www out of the heat treating chamber 3200 and carries the www to the front liquid treating chamber 3602.

An anti-reflective film is applied on the www in the front liquid treating chamber 3602.

The carrying robot 3422 takes the www out of the front liquid treating chamber 3602 and loads the www into the heat treating chamber 3200. In the heat treating chamber 3200, the heating process and the cooling process are sequentially performed, and when each heat treating process is completed, the carrying robot 3422 takes the www out of the heat treating chamber 3200 and carries the www to the rear liquid treating chamber 3604.

Then, a photoresist film is applied on the www in the rear liquid treating chamber 3604. The carrying robot 3422 takes the www out of the rear liquid treating chamber 3604 and loads the www into the heat treating chamber 3200. In the heat treating chamber 3200, the heating process and the cooling process are sequentially performed, and when each heat treating process is completed, the carrying robot 3422 carries the www to the rear buffer 3804. The first robot 4602 of the interface module 40 takes the www out of the rear buffer 3804 and carries the www to the additional process chamber 4200.

The edge exposure process is performed on the www in the additional process chamber 4200.

Then, the first robot 4602 takes the www out of the additional process chamber 4200 and carries the www to the interface buffer 4400. Then, the second robot 4606 takes the www out of the interface buffer 4400 and carries the www to the exposing device 50. The developing process S80 is performed by sequentially performing a heat treating process S81 in the heat treating chamber 3200, a developing process S82 in the liquid treating chamber 3600, and a heat treating process S83 in the heat treating chamber 3200.

Hereinafter, one example of a carrying path of the www from the exposing device 50 to the vessel 10 will be described.

The second robot 4606 takes the www out of the exposing device 50 and carries the www to the interface buffer 4400. Then, the first robot 4602 takes the www out of the interface buffer 4400 and carries the www to the rear buffer 3804. The carrying robot 3422 takes the www out of the rear buffer 3804 and carries the www to the heat treating chamber 3200. In the heat treating chamber 3200, the heating process and the cooling process of the www are sequentially performed. When the cooling process is completed, the www is carried to the developing chamber 3600 by the carrying robot 3422. In the developing chamber 3600, a developing process is performed by supplying a developer onto the www.

The www is taken out of the developing chamber 3600 by the carrying robot 3422 and is loaded into the heat treating chamber 3200. The heating process and the cooling process are sequentially performed on the www in the heat treating chamber 3200. When the cooling process is completed, the www is taken out of the heat treating chamber 3200 by the carrying robot 3422 and is carried to the front buffer 3802.

Then, the index robot 2200 takes the www from the front buffer 3802 and carries the www to the vessel 10.

The treating block of the substrate treating apparatus 1 has been described to perform the application process and the developing process. However, contrary to this, the substrate treating apparatus 1 may include only the index module 20 and a processing block 37, without the interface module. In this case, the processing block 37 performs only the application process, and the film applied onto the www may be a spin on hardmask film (SOH).

The foregoing detailed description illustrates the present invention. In addition, the above description shows and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A liquid supplying unit, comprising:
a nozzle;
a liquid supply pipe configured to supply a treatment liquid to the nozzle in a flow direction; and
an impurity removing unit installed in the liquid supply pipe to remove an impurity in the treatment liquid,
wherein the impurity removing unit includes:
a measuring unit configured to measure a characteristic of the impurity in the treatment liquid and form impurity data;
a vibrating unit configured to apply vibration to the treatment liquid, the vibrating unit downstream of the measuring unit in the flow direction;
a capturing unit configured to adsorb the impurity in the treatment liquid to which the vibration is applied; and
a control unit configured to
control the measuring unit and the vibrating unit, and based on the impurity data exceeding a reference data range, operates the vibrating unit.

2. The liquid supplying unit of claim 1, wherein the control unit is configured to determines a vibration frequency of the vibrating unit based on the characteristic of the impurity measured in the measuring unit.

3. The liquid supplying unit of claim 2, wherein the vibration frequency is a frequency at which the impurity in the treatment liquid is adsorbed to a bubble in the treatment liquid.

4. The liquid supplying unit of claim 3, wherein the vibration frequency is provided by overlapping a plurality of frequencies.

5. The liquid supplying unit of claim 1, wherein the measuring unit and the vibrating unit are adjacently provided.

6. The liquid supplying unit of claim 1, wherein the vibrating unit and the capturing unit are adjacently provided.

7. The liquid supplying unit of claim 1, wherein the measuring unit includes a photographing member configured to photographs a state of the impurity and forms the impurity data.

8. The liquid supplying unit of claim 1, wherein the measuring unit includes a wire mesh provided in a form of a mesh on a surface perpendicular to the flow direction of the treatment liquid within the liquid supply pipe, and
the wire mesh is configured to measures electrical conductivity of the wire mesh and forms the impurity data.

9. The liquid supplying unit of claim 1, wherein the measuring unit includes a speed measuring device configured to measures a movement speed of the impurity within the liquid supply pipe and forms the impurity data.

10. The liquid supplying unit of claim 1, wherein the vibrating unit includes any one of a coil motor, a magnetostrictive actuator, and a piezoelectric element.

11. The liquid supplying unit of claim 1, wherein the capturing unit is made of a porous material.

12. The liquid supplying unit of claim 1, wherein the capturing unit is provided as an electric field generating device.

13. The liquid supplying unit of claim 1, wherein the capturing unit further includes:
- a collecting pipe connected to an upper portion of the liquid supply pipe; and
- a decompressing member configured to provide negative pressure into the collecting pipe, and
- the control unit is configured to operates the vibrating unit and the decompressing member based on the impurity data exceeding the reference data range.

14. The liquid supplying unit of claim 1, wherein the characteristic of the impurity includes at least one of presence or absence of the impurity, a size of the impurity, and a density of the impurity in the treatment liquid.

\* \* \* \* \*